MICROWAVE PULSE CIRCUITS

Filed Oct. 31, 1956

INVENTOR
O. E. DE LANGE
BY Alan C. Rose
ATTORNEY

United States Patent Office 2,912,581

Patented Nov. 10, 1959

2,912,581

MICROWAVE PULSE CIRCUITS

Owen E. De Lange, Rumson, N.J., assignor to Bell Telephone Laboratories, Incorporated, New York, N.Y., a corporation of New York Application October 31, 1956, Serial No. 619,432

10 Claims. (Cl. 250—27)

This invention relates to microwave pulse circuits and more specifically to a circuit for combining two microwave pulse signals.

In computer and data processing circuits, it is often desirable to combine two binary input signals to produce an output signal when either one or both of the input signals are present. Such a circuit is termed an "Or" circuit in computer parlance. As disclosed in W. M. Goodall application Serial No. 619,435, filed October 31, 1956, and entitled "Microwave Data Processing Circuits," a simple form of Or circuit for microwave pulse circuits is a hybrid junction. A hybrid junction characteristically has two pairs of conjugate arms. Microwave signal energy applied to one arm of one pair of conjugate arms of a hybrid junction divides equally between the two arms of the other pair. When employed as a microwave Or circuit, the two input pulse signals are applied to one pair of conjugate arms of the hybrid junction. One arm of the other pair is terminated in a resistance and the remaining arm is the output circuit. Input signal energy divides between the output circuit and the resistive termination when either or both of the two input signals are present.

While the microwave Or circuit described above is quite satisfactory, it has the disadvantage that one half of the input signal energy is dissipated in the resistive termination. Accordingly, one object of the present invention is to increase the efficiency of microwave Or circuits.

In accordance with the present invention, one of the arms of a hybrid junction in a microwave Or circuit is provided with a crystal detector. The microwave output from the hybrid junction is connected to an additional wave guide component which transmits or blocks applied signals in accordance with the impedance of an asymmetrically conducting device which is included in its structure. The detector in the hybrid junction is connected to change the impedance of the asymmetrically conducting device to the state in which output signals are transmitted through the additional wave guide component.

An advantage of the invention is the pulse regeneration effect which is provided by the Or circuit described above. With the asymmetrically conducting device biased to the impedance state required for blocking input signals at low power levels, noise is eliminated, and distorted input signal pulses are squared up.

It is a feature of the invention that a diode is connected to the fourth arm of a hybrid junction which is employed as an Or circuit for microwave pulse signals, and the diode output is employed to obtain pulse regeneration.

It is a further feature of this invention that a detector diode be connected in one conjugate arm of a hybrid junction in a microwave logic circuit and that the other conjugate arm be the output wave guide, a microwave component being connected to the output wave guide and having a diode in a wave guide associated therewith.

In accordance with another feature of this invention, the diode in the wave guide associated with the microwave component in the output wave guide of the hybrid junction is normally biased so as to preclude any output from the microwave component, the detector diode being coupled to that diode to allow an output on detection of input signals to the hybrid junction.

Other objects, advantages, and features of the invention may be readily apprehended from the following detailed description and from the drawings, in which.

Figure 1:
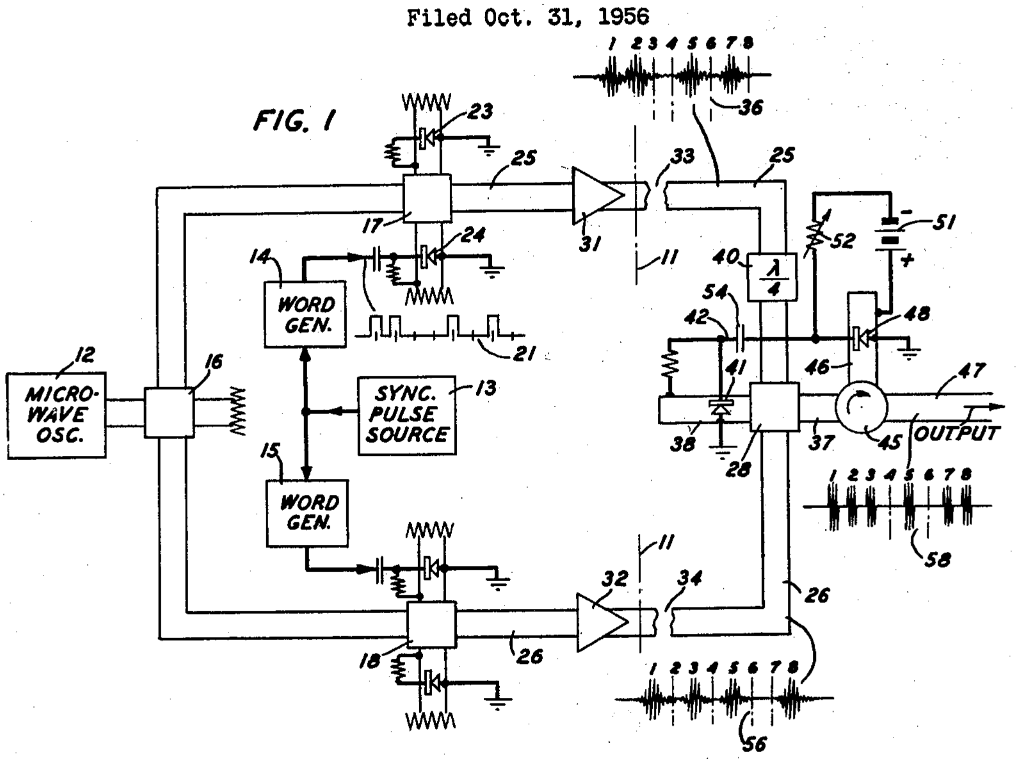
Fig. 1 shows a microwave Or circuit in accordance with the invention.

Referring to the drawings, Fig. 1 shows, by way of example, a microwave Or circuit and the pulse generation circuitry which may be employed to energize it. In Fig. 1, the Or circuit per se appears to the right of the dash-dot line 11, while the pulse generation circuitry appears to the left of this vertical line. The Or circuit is applicable to microwave computer and data processing circuits, such as those disclosed in the Goodall application identified above. The pulse generation circuitry was discussed in some detail in the application of W. M. Goodall mentioned above, and therefore will be reviewed only briefly before passing on to a consideration of the Or circuit per se.

Referring to the pulse generation circuitry, it includes a microwave oscillator 12, a synchronizing pulse source 13, two word generators 14 and 15, and the hybrid junctions 16, 17, and 18. The pulse trains produced by the pulse generation circuits shown in Fig. 1 have a relatively high pulse repetition rate. For example, the pulse repetition rate may be from 50,000,000 to over 100,000,000 digits per second.

In serial binary computing apparatus, numbers are characteristically represented by a series of pulses. In general, a series of time slots are established, and binary signals are represented by the presence or absence of pulses in successive time slots. The presence of a pulse in a particular time slot or digit period may correspond to the binary symbol "1," and the absence of a pulse may correspond to the binary symbol "0." The pulses representing a single number appear in a group of consecutive digit periods, which is normally designated a "word period."

Referring to Fig. 1, the pulse pattern 21 appears at the output of the word generator 14. The pulse pattern 21 is an eight-digit "word" which represents the binary code group 11001010. The correspondence between the pulse pattern 21 and the binary code group indicated above may be noted from the presence in the pulse train 21 of pulses in digit periods 1, 2, 5, and 7.

The synchronizing pulse source 13 applies pulses to the word generators 14 and 15 simultaneously. The word generators 14 and 15 may, for example, include tapped delay lines through which the synchronizing pulses are transmitted. Diode switching circuits connected to taps along the delay lines may have their outputs connected in parallel. In accordance with the enabling or disabling of the successive switching circuits connected to the taps of the delay line, pulses appear in successive digit periods as indicated in the pulse train 21.

The oscillator 12 may, for example, be a klystron oscillator having a frequency of approximately five kilomegacycles. Energy applied to the hybrid junction 16 divides, and one half of it is applied to each of the hybrid junctions 17 and 18. The hybrid junctions 16 through 18 may, for example, be "magic T" wave guide structures, such as that shown in Fig. 12.4–7 on page 643 of a text entitled "Principles and Applications of Wave Guide Transmission" by George C. Southworth, D. Van Nostrand Co., Inc., New York, 1950. The hybrid junctions may also take the form described in an article entitled "Directional Couplers" by W. W. Mumford, Proceedings of the I.R.E., February, 1947 at page 160. Other known hybrid junctions may also be employed.

Code signals from the word generator 14 are impressed on the electromagnetic waves from the oscillator 12 in the hybrid junction 17. When no bias is applied to the crystals 23 and 24 associated with two of the conjugate arms of hybrid 17, microwave energy from the oscillator 12 is reflected equally from the two crystals, and no energy is coupled to wave guide 25. However, when pulses from the word generator 14 are applied to the crystal 24, its impedance state is changed with respect to that of the crystal 23, and a pulse of microwave energy appears on wave guide 25. Accordingly, a train of microwave pulses corresponding to the direct current pulses in pulse train 21 is applied to the wave guide 25. Simultaneously, a similar train of pulses is applied to wave guide 26 from hybrid junction 18.

Energy from the wave guides 25 and 26 is coupled to the hybrid junction 28, which is part of the present microwave Or circuit per se. The pulse amplifiers 31 and 32 are interposed in the wave guides 25 and 26 between hybrid junctions 17 and 18, respectively, and the hybrid junction 28. The pulse amplifiers 31 and 32 are broad-band microwave amplifiers of the distributed coupling type, such as traveling wave tubes. This type of amplifier is employed in view of the relatively broad-band high frequency amplification which is required. The wave guides 25 and 26 are shown with breaks at 33 and 34, respectively, to indicate that other computer or data processing circuitry may be included or coupled to these wave guides. Following the break 33, the wave form of the microwave pulse train may appear as indicated at 36. The bursts of microwave energy are somewhat attenuated and also may be somewhat distorted. The wave guides 25 and 26 are connected to two conjugate arms of the hybrid 28. When microwave signals are applied to the hybrid 28 from either or both of wave guides 25 and 26, output microwave signal pulses appear on wave guide 37. In addition, signals are applied to the wave guide 38, which is conjugate with respect to wave guide 37 in its connection to the hybrid junction 28. The diode 41 in wave guide 38 detects the microwave energy applied to wave guide 38, and applies a direct current pulse to the control lead 42.

Certain precautions must be taken to insure output signals from hybrid 28 on both wave guides 37 and 38. Normally, if the two input signals have the same amplitude, one or the other of the two output wave guides will be energized, depending on whether the signals are in phase or one hundred and eighty degrees out of phase. If the two signals have different input levels or are ninety degrees out of phase, for example, energy is coupled to both output wave guides. In Fig. 1, the quarter wavelength block 40 is shown inserted in wave guide 25 to indicate a phase difference of ninety degrees in the two pulse input signals to hybrid junction 28. This ninety degree phase difference will be present with any odd number of quarter wavelengths difference in the wave guide paths from the microwave oscillator 12 to the two inputs to the hybrid junction 28.

Another wave guide component 45 which may, for example, be a circulator, is connected to receive microwave energy from the wave guide 37. A circulator is a nonreciprocal device which couples energy to successive output terminals. Thus, for example, microwave energy applied to circulator 45 from wave guide 37 is coupled to wave guide 46. Any energy which may be reflected back from wave guide 46 toward circulator 45 is coupled to output wave guide 47. This is, of course, contrary to the normal reciprocal mode of operation expected of passive wave guide components. Circulators normally include magnetized ferrite material to provide their nonreciprocal properties. A typical circulator is disclosed in the application of W. M. Goodall cited above.

The crystal 48 in wave guide 46 is normally biased in the low resistance direction by a suitable source of voltage 51 and the variable resistor 52. The bias is adjusted to provide an impedance match at low microwave signal levels. Under these conditions, any low level noise which appears in wave guide 37 and which is applied to circulator 45 is coupled to wave guide 46, and is absorbed by the crystal 48. When a pulse of microwave energy is rectified by the diode 41 associated with the hybrid junction 48, however, a positive pulse is applied to the control lead 42. Diode 41 may be back-biased, if desired, so that it does not conduct until the pulse amplitude exceeds a preassigned threshold level. The positive pulse is coupled by condenser 54 to the crystal 48, and biases it in the high resistance state. Under these circumstances, the diode 48 has little effect on microwave transmission, and the microwave signal pulse applied on wave guide 37 to circulator 45 is reflected back from the end of wave guide stub 46 to the circulator 45. The reflected pulse of microwave energy is then coupled to the output wave guide 47.

The input microwave pulse trains 36 and 56 applied on wave guides 25 and 26 to the hybrid junction 28 will now be compared with the output microwave pulse train 58 which appears on wave guide 47. Initially, it may be noted that the pulse train 58 includes a microwave pulse in every pulse position except pulse positions 4 and 6. It may also be noted that these pulse positions 4 and 6 are the only pulse positions in the wave forms 36 and 56 which do not include microwave pulses. Another significant factor about wave form 58 is the relative sharpness of the individual pulses as compared with pulse trains 36 and 56. The individual pulses in pulse trains 36 and 56 have gradually sloping leading and trailing edges. In addition, a considerable amount of low level noise is present in pulse trains 36 and 56 between the pulses. As explained in connection with the operation of circulator 45, however, the crystal diode 48 absorbs low level input signals. Signals are not reflected from wave guide 46 until an appreciable input level is attained. Accordingly, the Or circuit of Fig. 1 has accomplished a considerable amount of noise suppression and pulse regeneration.

Figure 2:
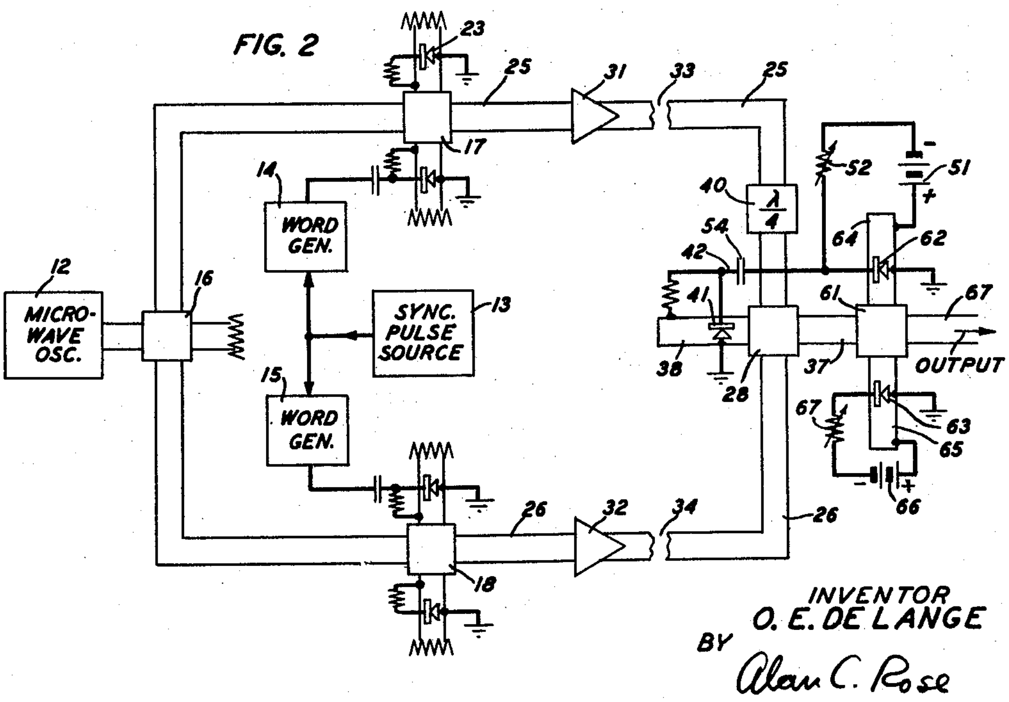
Fig. 2 is an alternative version of the Or circuit of Fig. 1.

The circuit of Fig. 2 is quite similar to that of Fig. 1. Accordingly, reference numerals have been employed which generally coincide with those used in Fig. 1. In place of the circulator 45 of Fig. 1, however, a hybrid junction 61 is employed in the circuit of Fig. 2. The hybrid junction 61 includes diodes 62 and 63 in two branch arms. Signals applied on wave guide 37 to the hybrid junction 61 are coupled to the branch arms 64 and 65, which include diodes 62 and 63, respectively. The diodes 62 and 63 are biased by circuits including components 51, 52, 66, and 67 to provide a low level impedance match. When no microwave energy is received by crystal 41, the microwave energy is therefore absorbed by crystals 62 and 63. When a positive pulse is applied to control lead 42 by the diode 41, however, the impedance state of diode 62 is changed from low to high, and the reflected microwave pulse is coupled to output lead 68. Accordingly, the circuit of Fig. 2 performs substantially the same function as that of Fig. 1 in much the same manner.

It is to be understood that the above-described arrangements are illustrative of the application of the principles of the invention. Numerous other arrangements may be devised by those skilled in the art without departing from the spirit and scope of the invention.

What is claimed is:

1. A combined microwave Or circuit and pulse regenerator comprising a hybrid junction, a signal detector connected to a first arm of said hybrid junction, a branching wave guide component connected to receive microwave signals from another arm of said hybrid junction, two wave guides coupled to said component, a diode located in one of said wave guides, means for biasing said diode to one impedance state, means connecting said detector to said diode for changing the impedance of said diode, and means for applying two distinct pulse trains, respectively, to the other two arms of said hybrid junction.

2. A microwave Or circuit comprising a hybrid junction, a signal detector connected to a first arm of said hybrid junction, a branching wave guide component connected to receive microwave signals from another arm of said hybrid junction, two wave guides coupled to said component, a diode located in one of said wave guides, means for biasing said diode to one impedance state, means connecting said detector to said diode for changing the impedance of said diode, means for applying two distinct pulse trains, respectively, to the other two arms of said hybrid junction, and means for synchronizing the timing of the individual pulses in the pulse trains applied to said hybrid junction.

3. A microwave Or circuit comprising a hybrid junction, a signal detector connected to a first arm of said hybrid junction, means for applying two distinct microwave pulse trains, respectively, to two other arms of said hybrid junction, a wave guide switching component connected to receive microwave signals from the other arm of said hybrid junction, means including a diode coupled to said switching component for changing the state of said switching component, said diode normally having one impedance state, and means connecting said detector to said diode for changing the impedance state of said diode upon the application of microwave pulses to said hybrid junction.

4. A combination as defined in claim 3 wherein a single microwave signal source supplies carrier signals for both of said pulse trains, and wherein the lengths of the wave guides connected between said microwave source and said hybrid junction differ by an odd number of quarter wavelengths.

5. A microwave Or circuit comprising a hybrid junction, a signal detector connected to a first arm of said hybrid junction, means for applying two distinct pulse trains, respectively, to two other arms of said hybrid junction, a wave guide switching component connected to receive microwave signals from the other arm of said hybrid junction, means including a diode coupled to said switching component for changing the state of said switching component, means for biasing said diode to absorb applied microwave signals, and means connecting said detector to said diode for changing the impedance state of said diode upon the application of microwave pulses to said hybrid junction.

6. In combination, a wave guide junction component including two input wave guides and an output wave guide, means for applying two distinct microwave pulse signals respectively to said two input wave guides, a signal detector coupled to said junction component, a wave guide switch connected to receive microwave output signals from said output wave guide, means including a diode coupled to said switch for changing the state of said switch, means for biasing said diode to absorb applied microwave signals, and means connecting said detector to said diode for changing the impedance state of said diode upon the application of microwave pulses to said junction component.

7. A microwave logic circuit comprising a first microwave component having two conjugate arms and at least one input, detector means coupled to one of said conjugate arms, a second microwave component coupled to the other of said conjugate arms, diode means connected to said second microwave component, means normally biasing said diode means to prevent passage of signals in said other conjugate arm, and means coupling said detector means to said diode means to bias said diode means to allow passage of said signals on detection of input signals to said first microwave component.

8. A microwave logic circuit comprising a first microwave component having two conjugate arms and at least one input wave guide, detector means situated in one of said conjugate arms, a second microwave component coupled to the other of said conjugate arms and having at least one wave guiding means connected thereto, diode means situated in said wave guiding means, means normally biasing said diode means to prevent passage of input signals through said second microwave component, and means coupling said detector means to said diode means to bias said diode means to allow passage of said signals on detection of input signals to said first microwave component.

9. A microwave logic circuit in accordance with claim 8 wherein said second microwave component is a circulator.

10. A microwave logic circuit in accordance with claim 8 wherein said second microwave component is a hybrid junction.

References Cited in the file of this patent

UNITED STATES PATENTS

| | | |
|---|---|---|
| 2,735,933 | Pierce | Feb. 21, 1956 |
| 2,789,211 | Sprague | Apr. 16, 1957 |